(12) United States Patent
Han et al.

(10) Patent No.: US 12,084,754 B2
(45) Date of Patent: Sep. 10, 2024

(54) MASK PLATE AND EVAPORATION SYSTEM

(71) Applicant: KunShan Go-Visionox Opto-Electronics Co., Ltd, Jiangsu (CN)

(72) Inventors: Bing Han, Kunshan (CN); Weili Li, Kunshan (CN); Mingxing Liu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 216 days.

(21) Appl. No.: 17/569,161

(22) Filed: Jan. 5, 2022

(65) Prior Publication Data
US 2022/0127712 A1 Apr. 28, 2022

Related U.S. Application Data

(63) Continuation of application No. PCT/CN2020/112629, filed on Aug. 31, 2020.

(30) Foreign Application Priority Data

Nov. 21, 2019 (CN) .......................... 201911151359.8

(51) Int. Cl.
*C23C 14/04* (2006.01)
*C23C 14/24* (2006.01)

(52) U.S. Cl.
CPC ............ *C23C 14/042* (2013.01); *C23C 14/24* (2013.01)

(58) Field of Classification Search
CPC .................................................. C23C 14/042
See application file for complete search history.

(56) References Cited

U.S. PATENT DOCUMENTS 4,779,897 A * 10/1988 Schall ...................... B42C 7/00
281/38
5,156,727 A * 10/1992 Bjornard ............... C23C 14/044
204/298.25

(Continued)

FOREIGN PATENT DOCUMENTS

CN 1651598 A 8/2005
CN 203386116 * 1/2014 ............... G06F 1/16

(Continued)

OTHER PUBLICATIONS

International Search Report (with English translation) and Written Opinion (with English translation) issued on Dec. 1, 2020 in corresponding International Application No. PCT/CN2020/112629; 15 pages.

(Continued)

*Primary Examiner* — Keath T Chen
(74) *Attorney, Agent, or Firm* — Maier & Maier, PLLC

(57) ABSTRACT

A mask plate and an evaporation system. The mask plate includes at least one mask strip. Folding structures are connected to two opposite sides of the at least one mask strip. At least one group of effective evaporation area and transition area located around the effective evaporation areas are arranged on the at least one mask strip. Each folding structure includes a foldable part and a support part connected to each other. The foldable part is connected to the support part and the mask strip. The foldable part and at least part of the support part are sequentially stacked on one side of the two opposite sides of the mask strip, and the foldable part covers at least part of the transition area close to the folding structure of the mask strip.

18 Claims, 4 Drawing Sheets

(56) References Cited

U.S. PATENT DOCUMENTS

| | | | | |
|---|---|---|---|---|
| 5,924,812 | A | * | 7/1999 | Goldman .............. B42F 21/02 |
| | | | | 281/38 |
| 2005/0115503 | A1 | * | 6/2005 | Hagiwara ............ H10K 71/166 |
| | | | | 438/440 |
| 2005/0167395 | A1 | | 8/2005 | Lee et al. |
| 2010/0226079 | A1 | * | 9/2010 | Fujikawa ............. G06F 1/1601 |
| | | | | 361/679.01 |
| 2013/0276978 | A1 | * | 10/2013 | Bluck ................ H01L 21/6734 |
| | | | | 118/500 |
| 2020/0407836 | A1 | * | 12/2020 | Luo ...................... H10K 71/00 |
| 2021/0280788 | A1 | * | 9/2021 | Ding ..................... H10K 71/70 |
| 2022/0098719 | A1 | * | 3/2022 | Han ..................... C23C 14/042 |

FOREIGN PATENT DOCUMENTS

| | | | |
|---|---|---|---|
| CN | 103668051 | A | 3/2014 |
| CN | 103911583 | A | 7/2014 |
| CN | 105549321 | A | 5/2016 |
| CN | 106521411 | A | 3/2017 |
| CN | 206692716 | U | 12/2017 |
| CN | 206721352 | U | 12/2017 |
| CN | 108179381 | A | 6/2018 |
| CN | 108517490 | A | 9/2018 |
| CN | 108559946 | A | 9/2018 |
| CN | 108611594 | A | 10/2018 |
| CN | 108642440 | A | 10/2018 |
| CN | 108642441 | A | 10/2018 |
| CN | 109487215 | A | 3/2019 |
| CN | 208604193 | U | 3/2019 |
| CN | 110846614 | A | 2/2020 |
| JP | H1161379 | A | 3/1999 |
| JP | 2018-138698 | A | 9/2018 |
| KR | 10-2012-0022135 | A | 3/2012 |
| WO | WO 2013159050 | * | 10/2013 ........... C23C 14/042 |

OTHER PUBLICATIONS

First Chinese Office Action mailed on Mar. 3, 2021, for Chinese Application No. 201911151359.8; 16 pages (with English translation).

Second Chinese Office Action mailed on Sep. 1, 2021, for Chinese Application No. 201911151359.8; 14 pages (with English translation).

Office Action issued on Feb. 9, 2022, in connection with corresponding Chinese Application No. 201911151359.8 (6 pp., including machine-generated English translation).

* cited by examiner

MASK PLATE AND EVAPORATION SYSTEM

CROSS REFERENCE

The present application is a continuation-application of International (PCT) Patent Application No. PCT/CN2020/112629, filed on Aug. 31, 2020, which claims priority of Chinese Patent Application No. 201911151359.8, filed on Nov. 21, 2019, which is entirely incorporated into the present application by reference.

TECHNICAL FIELD

The present disclosure relates to the field of display technology, and more particularly to a mask plate and an evaporation system.

BACKGROUND

Currently, when preparing a display panel, it is generally necessary to use an opening of a mask plate to evaporate evaporation material onto a predetermined position by evaporation. However, the structural design of a current mask plate makes it difficult to achieve a requirements of narrow bezel display panel.

SUMMARY

The technical problem mainly solved by present disclosure is to provide a mask plate and an evaporation system, which can reduce a bezel width of a display panel.

To solve the technical problem described above, one technical solution adopted in the present disclosure is to provide a mask plate. The mask plate includes at least one mask strip. Each of two opposite sides of the at least one mask strip connects with a folding structure. The at least one mask strip is provided with at least one group of effective evaporation area and transition area located around the effective evaporation area. Wherein the folding structure includes a foldable part and a support part connected to each other. The foldable part connects the support part and the at least one mask strip. The foldable part and at least part of the support part are successively superposed on one of the two opposite sides of the at least one mask strip. The foldable part covers at least part of the transition area of the at least one mask strip close to the folding structure.

Wherein the effective evaporation area of the at least one mask strip has a first boundary close to the folding structure. There is a first junction between the at least one mask strip and the folding structure. A horizontal distance between the first boundary and the first junction is equal to a horizontal width of the foldable part adjacent to the at least one mask strip.

Wherein a length of the at least one mask strip in a direction parallel to the first boundary is equal to a length of the foldable part in a direction parallel to the first boundary.

To solve the technical problem described above, another technical solution adopted in the present disclosure is to provide an evaporation system. The evaporation system includes the mask plate of any one of the embodiments described above.

The benefit of the present disclosure is that: each of the two opposite sides of the at least one mask strip of the mask plate provided by the present disclosure connects with a folding structure. The folding structure includes a foldable part and a support part connected to each other. The foldable part connects the support part and the at least one mask strip. The foldable part and at least part of the support part are successively superposed on one of the two opposite sides of the at least one mask strip. The foldable part may cover at least part of the transition area of the at least one mask strip close to the folding structure. Since at least part of the transition area is sheltered by the folding structure, during a subsequent evaporation process, a range of a position of a substrate to be evaporated corresponding to the transition area on which evaporation material is evaporated is reduced, thereby reducing the bezel width of the display panel, and improving a bezel utilization of the display panel.

DETAILED DESCRIPTION

The technical solutions in the embodiments of the present disclosure will be described clearly and completely with reference to the figures in the embodiments of the present disclosure. Obviously, the described embodiments are only a part of the embodiments of the present disclosure, rather than all the embodiments. Based on the embodiments of the present disclosure, all other embodiments obtained by those skilled in the art without any creative work are within the scope of the present disclosure.

Currently, a mask strip of a mask plate is generally provided with an effective evaporation area and a transition area located around the effective evaporation area. The effective evaporation area is corresponding to an actual display area of a display panel; and a plurality of openings may be disposed in the effective evaporation area. In order to ensure a stability of a preparation process of the mask plate, a plurality of openings are also disposed in the transition area. However, during an evaporation, a position of a substrate to be evaporated corresponding to the transition area is also evaporated with evaporation material, which may further occupy part of a bezel space of the display panel, and result in difficulties in achieving a requirements of narrow bezel display panel.

Figure 1:
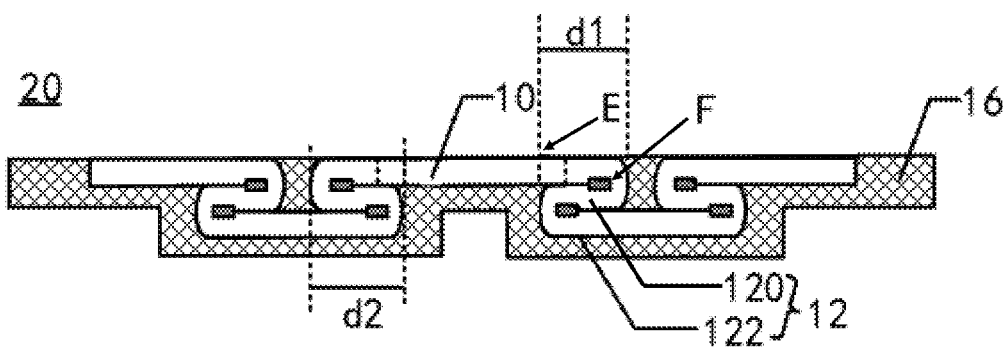
FIG. 1 is a structural schematic view of an embodiment of a mask plate provided by the present disclosure.
Figure 2:
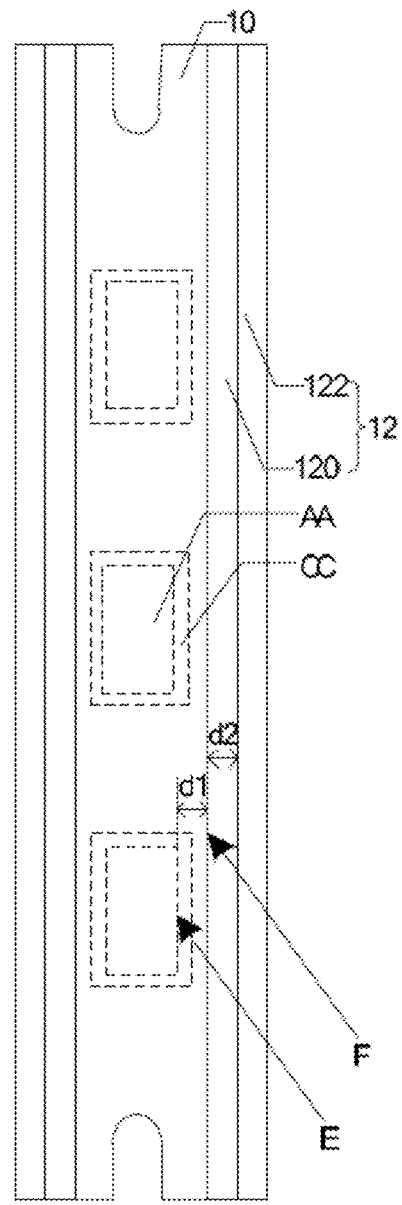
FIG. 2 is a structural schematic view of an embodiment of a mask strip and a folding structure of FIG. 1 before being folded.

Please refer to FIGS. 1-2, FIG. 1 is a structural schematic view of an embodiment of a mask plate provided by the present disclosure, and FIG. 2 is a structural schematic view of an embodiment of a mask strip and a folding structure of FIG. 1 before being folded. The mask plate 20 may be a precision mask plate, which includes at least one mask strip 10. Each of two opposite sides of the at least one mask strip 10 connects with a folding structure 12. The mask strip 10 is provided with at least one group of effective evaporation area AA and transition area CC located around the effective evaporation area AA. A plurality of effective evaporation areas AA provided on the mask strip 10 are disposed on a same row. A plurality of openings are disposed in each of the effective evaporation area AA and the transition area CC, and a size of the effective evaporation area AA is the same as a size of the actual display area of the display panel. Wherein a plurality of mask strips 10 of the mask plate 20 are disposed on a same horizontal plane. The folding structure 12 includes a foldable part 120 and a support part 122 connected to each other. The foldable part 120 connects the support part 122 and the mask strip 10. The foldable part 120 and at least part of the support part 122 are successively superposed on one of the two opposite sides of the mask strip 10. The foldable part 120 covers at least part of the transition area CC of the mask strip 10 close to the folding structure 12.

Since at least part of the transition area CC is sheltered by the folding structure 12, during an subsequent evaporation, a range of the position of the substrate to be evaporated corresponding to the transition area CC on which the evaporation material is evaporated is reduced, thereby reducing a bezel width of the display panel, and improving a bezel utilization of the display panel.

In one embodiment, as shown in FIGS. 1 and 2, the effective evaporation area AA of the mask strip 10 has a first boundary E close to the folding structure 12. There is a first junction F between the mask strip 10 and the folding structure 12. A horizontal distance d1 between the first boundary E and the first junction F is equal to a horizontal width d2 of the foldable part 120 adjacent to the mask strip 10. It should be noted that, when the foldable part 120 is formed by one or more layers arranged in a stack, the horizontal width d2 of the foldable part 120 described above is a horizontal extension width of the foldable part 120 after being folded in a direction perpendicular to the first boundary E. Further, a length of the mask strip 10 in a direction parallel to the first boundary E is equal to a length of the foldable part 120 in a direction parallel to the first boundary E, so that, after being folded, the foldable part 120 can cover the transition area CC in a direction parallel to the first boundary E.

The above way of design may make the foldable part 120 after being folded completely block the openings in the transition area CC between the first boundary E and the first junction F, and not block the openings in the effective evaporation area AA of the mask strip 10. That is, the folding structure 12 itself may be utilized for folding deformation, so as to block the transition area CC of the side of the mask strip 10 close to the folding structure 12, so that, during a subsequent evaporation, the position of the substrate to be evaporated corresponding to the transition area CC would not be evaporated with the evaporation material, thereby facilitating a realization of narrow bezel design of the display panel, and improving the bezel utilization of the display panel.

Figure 3:
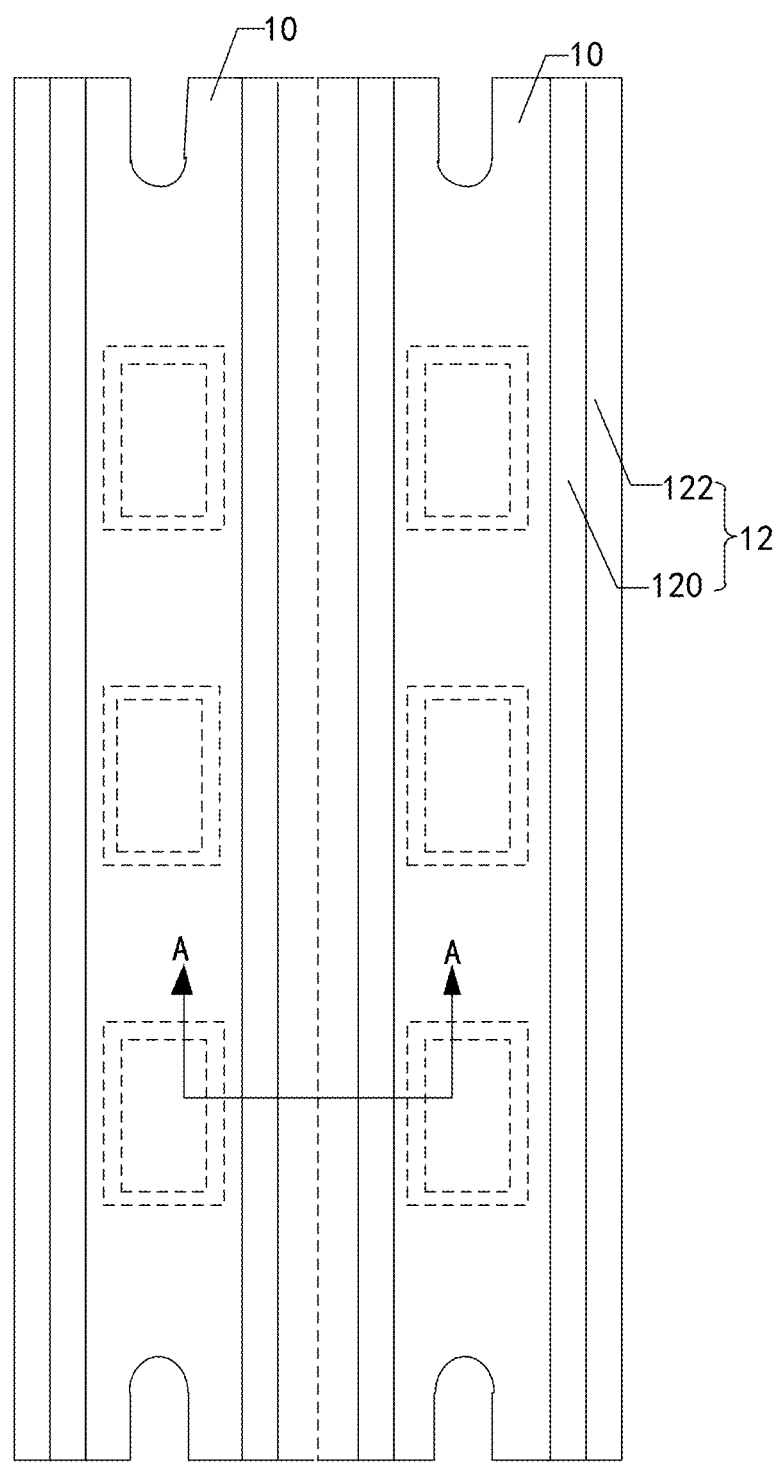
FIG. 3 is a structural schematic view of an embodiment of a plurality of mask strips and folding structures of FIG. 1 before being folded.
Figure 4:
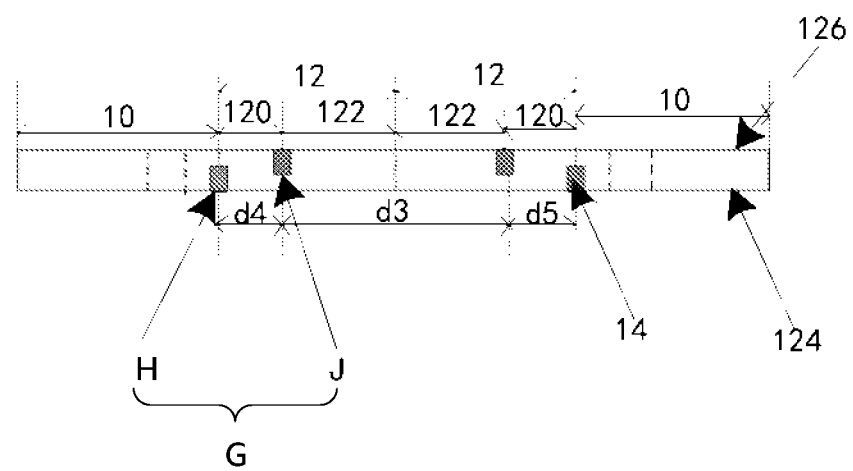
FIG. 4 is a cross-sectional view of an embodiment of FIG. 3 along 4-4 line.

In another embodiment, as shown in FIGS. 3 and 4, FIG. 3 is a structural schematic view of an embodiment of adjacent two mask strips of FIG. 1; FIG. 4 is a cross-sectional view of an embodiment of FIG. 3 along 4-4 line. The support part 122 of the folding structure 12 of one of the adjacent two mask strips 10 connects with the support part 122 of the folding structure 12 of the other of the adjacent two mask strips 10. In other words, support parts 122 of folding structures 12 connected to adjacent mask strips 10 may connect with each other. For example, the support part 122 of the folding structure 12 of one of the adjacent two mask strips 10 is integrated with the support part 122 of the folding structure 12 of the other of the adjacent two mask strips 10. In other words, adjacent support parts 122 may be integrally formed. The mask strip 10 is integrated with the folding structure 12 connected to it. In this way, a plurality of traditional individual mask strips 10 could be combined for unified production, thereby improving a production efficiency of the mask strips 10. In other embodiments, the support part 122 of the folding structure 12 of one of the adjacent two mask strips 10 and the support part 122 of the folding structure 12 of the other of the adjacent two mask strips 10 may also be formed separately, or disconnected from each other, the present disclosure is not limited thereto.

Further, as shown in FIG. 4, a sum of a horizontal width of the support part 122 of the folding structure 12 of one of the adjacent two mask strips 10 and a horizontal width of the support part 122 of the folding structure 12 of the other of the adjacent two mask strips 10 (i.e., d3 in FIG. 4) is greater than or equal to a sum of a horizontal width of the foldable part 120 of the folding structure 12 of one of the adjacent two mask strips 10 and a horizontal width of the foldable part 120 of the folding structure 12 of the other of the adjacent two mask strips 10 (i.e., d4+d5 in FIG. 4). That is, a sum of horizontal widths d3 of the support parts 122 of adjacent folding structures 12 is greater than or equal to a sum of horizontal widths (i.e., d4+d5 in FIG. 4) of the foldable parts 120 of the adjacent folding structures 12. In this way, the foldable parts 120 of the two adjacent folding structures 12 after being folded could just abut against each other or define an interval between them (as shown in FIG. 1), thereby reducing the probability that the adjacent folding structures 12 protrude after being folded, so as to ensure that the adjacent mask strips 10 are on the same horizontal plane, and to improve the stability of mask plate 20. It should be noted that, when the foldable part 120 is formed by one or more layers arranged in a stack, and when the support part 122 is formed by one or more layers arranged in a stack, the horizontal width refers to a horizontal extension width of the foldable part 120 after being folded in a direction perpendicular to the first boundary, and a horizontal extension width of the support part 122 in a direction perpendicular to the first boundary.

In another embodiment, as shown in FIG. 4, the foldable part 120 includes a plurality of foldable boundaries G; the foldable part 120 is folded along the plurality of foldable boundaries G to superpose between the mask strip 10 and the support part 122. The setting way of the plurality of foldable boundaries G described above may make a folding process of mask strip 10 more smoothly and easier to operate. For example, the foldable part 120 includes a first foldable boundary H and a second foldable boundary J, the first foldable boundary H is located between the foldable part 120 and the mask strip 10, and the second foldable boundary J is located between the foldable part 120 and the support part 122. After the foldable part 120 described above is folded along the first foldable boundary H and the second foldable boundary J, the foldable part 120 forms a layer arranged between the mask strip 10 and the support part 122. The setting way of the first foldable boundary H and the second foldable boundary J is simple, and could make the folding process easier. In other embodiments, the foldable part 120 may also include more foldable boundaries G, such that the foldable part 120 is folded into more layers along the plurality of foldable boundaries G to superpose between the mask strip 10 and the support part 122.

It is also possible to provide no foldable boundaries G on the foldable part 120. Industrial robots or human beings can fold according to the predetermined size of the foldable part 120 and the support part 122, but in such a way, folding efficiency and yield is low.

Figure 5:
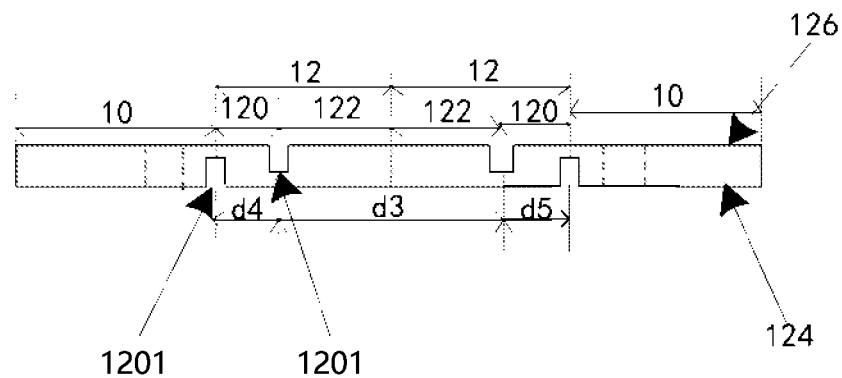
FIG. 5 is another structural schematic view of FIG. 4 without elastic material filled in the grooves.

In one application scenario, as shown in FIG. 4, in order to further improve the folding efficiency of the mask strip 10 and the folding structure 12, the first foldable boundary H and the second foldable boundary J are provided with grooves 1201, as is shown in FIG. 5. On the one hand, the grooves 1201 may serve as folding marks when the mask strip 10 and the folding structure 12 are folded, which is convenient for industrial robots or human beings to operate. On the other hand, the grooves 1201 may allow the mask strip 10 and the folding structure 12 to be folded with less folding resistance, and make the operation easily. When the folding structure 12 is unfolded and the support part 122 and the foldable 120 part are on a same horizontal plane, in the direction perpendicular to the surface of the mask strip 10, the folding structure 12 includes a first surface 124 and a second surface 126 disposed oppositely. The groove 1201 at the first foldable boundary H is located on the first surface 124, and the groove 1201 at the second foldable boundary J is located on the second surface 126. The folding process may be as follows: firstly, the foldable part 120 is folded along the second foldable boundary J, such that the mask strip 10, which is on the left side of the second foldable boundary J, and the foldable part 120 are folded over the support part 122, and then the foldable part 120 is folded along the first foldable boundary H, with the mask strip 10 over the foldable part 120. After the folding process is completed, the grooves 1201 are located inside the bending area, which can reduce the bending stress experienced during the bending.

In the embodiment, the grooves 1201 described above may be arc grooves or tapered grooves. The arc grooves or tapered grooves are designed to facilitate bending and folding. A depth of the grooves is less than a thickness of the folding structure 12. In addition, as shown in FIG. 4, the mask plate 20 described above further includes elastic material 14. The elastic material 14 is filled within the grooves 1201. The elastic material 14 may be silica gel, etc. This setting way can not only make mask plate 20 be aesthetically pleasing, but also facilitate the bending and folding of the folding structure 12.

Of course, in other embodiments, it is also possible to provide no grooves at the first foldable boundary H and/or the second foldable boundary J, the first foldable boundary H and/or the second foldable boundary J may be directly formed of elastic material, the other parts of the folding structure 12 may have same material with the mask strip 10. Alternatively, the first foldable boundary H and/or the second foldable boundary J are provided with folding marks, such as color marks, etc, in this condition, the folding structure 12 may have same material with the mask strip 10.

Alternatively, the first foldable boundary H and/or the second foldable boundary J are provided with other movably connected structures such as hinges, etc, as long as structures on both sides of the first foldable boundary H and/or the second foldable boundary J could connect and fold with each other.

In another embodiment, material of the mask strip 10 and the folding structure 12 in the present disclosure is magnetic material, such as metal, etc. This design way may make the mask strip 10 be attracted by an external magnetic device during the evaporation, so that the mask strip 10 can better joint to a surface of the substrate to be evaporated, and evaporation effect is better. Furthermore, the foldable part 120 and part of the support part 122 successively superposed on one of the two opposite sides of the mask strip 10 may support the mask strip 10 under a magnetic attraction of the magnetic device, and further improve joint effect of mask strip 10 and the surface of the substrate to be evaporated. Of course, in other embodiments, the material of folding position of the folding structure 12 may be non-magnetic material, such as elastic material, etc., to which the present disclosure is not limited.

With continued reference to FIG. 1, the mask plate provided in the present disclosure may further include a frame 16, configured to fix a position of the plurality of mask strips 10. Both two ends of the mask strips 10 could be fixedly connected to the frame 16 by welding. In addition, in the present embodiment, as shown in FIG. 1, the frame 16 defines a plurality of receiving grooves 160 matching with folding structures 12 at positions corresponding to the folding structures 12. A shape of an inner wall of the receiving grooves 160 may be the same as a shape of an outer wall of the folding structures 12. The receiving grooves 160 are designed in such a way that may better limit positions of the folding structures 12, and reduce the probability that the position of the mask strip 10 contacted with the substrate to be evaporated protrudes.

Figure 6:
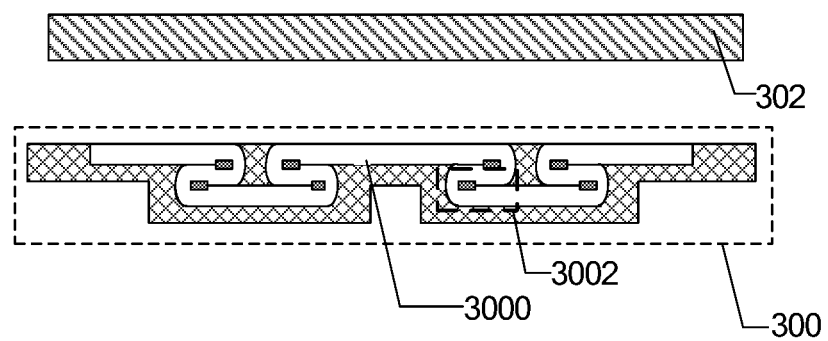
FIG. 6 is a structural schematic view of an embodiment of an evaporation system provided by the present disclosure.

Please refer to FIG. 6, which is a structural schematic view of an embodiment of the evaporation system provided by the present disclosure. The evaporation system 30 includes the mask plate 300 of any one of the embodiments described above. A specific structure of the mask plate 300 may be referred to the above embodiments, and will not be repeated here.

In addition, in the present embodiment, when the material of the mask strip 3000 of the mask plate 300 is magnetic material, the evaporation system 30 described above further includes a magnetic device 302. The magnetic device 302 is configured to adsorb the mask strip 3000. The magnetic device 302 may be an electromagnetic plate, etc. In an actual evaporation process, the magnetic device 302 and the mask plate 300 are located on the opposite sides of the substrate to be evaporated; the mask strip 3000 of the mask plate 300 is in contact with the surface of the substrate to be evaporated. The magnetic attraction force generated by the magnetic device 302 adsorbs the mask strip 3000, so that the mask strip 3000 joint well to the surface of the substrate to be evaporated 304. At this time, if the folding structure 3002 includes magnetic materials, the folding structure 3002 may support the mask strip 3000 under the magnetic attraction force.

In another embodiment, the mask plate includes a frame and at least one mask assembly. The frame defines receiving grooves. The at least one mask assembly comprises a mask strip and two folding structures. The mask strip is fixed on the frame. The mask strip is provided with an effective evaporation area and a transition area located around the effective evaporation area. The two folding structures are received in the receiving grooves. The folding structures and the receiving grooves are set in one-to-one correspondence. Wherein one of the two folding structures is connected to one side of the mask strip, the other one of the two folding structures is connected to an opposite side of the mask strip. Each of the two folding structures includes a foldable part and a support part. The foldable part is connected to the mask strip and stacked on the mask strip. Wherein at least part of the transition area adjacent to the folding stricture is covered by the foldable part. The support part is connected to the foldable part and stacked on the foldable part.

The above description are only embodiments of the present disclosure, and do not limit the scope of the present disclosure. Any equivalent structure or equivalent process transformation made by using the contents of the description and drawings of the present disclosure, or directly or indirectly used in other related technical fields, are similarly included in the scope of patent protection of the present disclosure.

What is claimed is:

1. A mask plate, comprising:
at least one mask strip, each of which comprising at least one effective evaporation area and each of which connecting, on two opposite sides, with a folding structure,
wherein each effective evaporation area is surrounded by a transition area,
wherein each effective evaporation area and each transition area are both provided with a plurality of openings,
wherein each folding structure comprises a support part and a foldable part, such that the foldable part connects the support part to one of the two opposite sides of the at least one mask strip and the folding structure is folded so as to sandwich the foldable part between the at least one mask strip and the support part,
wherein the foldable part comprises a plurality of foldable boundaries, and the foldable part is folded along the plurality of foldable boundaries to be disposed sandwiched between the at least one mask strip and the support part, and
wherein a width of the foldable part is dimensioned such that the foldable part blocks at least some of the plurality of openings of the at least one transition area but does not block any of the plurality of openings of the at least one effective evaporation area.

2. The mask plate of claim 1, wherein the effective evaporation area of the at least one mask strip has a first boundary close to the folding structure, there is a first junction between the at least one mask strip and the folding structure, and a horizontal distance between the first boundary and the first junction is equal to a horizontal width of the foldable part adjacent to the at least one mask strip.

3. The mask plate of claim 2, wherein a length of the at least one mask strip in a direction parallel to the first boundary is equal to a length of the foldable part in a direction parallel to the first boundary.

4. The mask plate of claim 1, wherein when the at least one mask strip is two or more mask strips and two adjacent folding structures of adjacent mask strips are joined by their respective support parts.

5. The mask plate of claim 4, wherein the support part of the folding structure of one of the mask strips is integrated with the support part of the folding structure of another one of the mask strips adjacent to the one of the mask strips; and the mask strips are integrated with the folding structure connecting to the mask strips.

6. The mask plate of claim 4, wherein the effective evaporation area of the mask strips has a first boundary close to the folding structure, a sum of a horizontal width of the support part of the folding structure of one of the mask strips and a horizontal width of the support part of the folding structure of another one of the mask strips adjacent to the one of the mask strips is greater than or equal to a sum of a horizontal width of the foldable part of the folding structure of the one of the mask strips and a horizontal width of the foldable part of the folding structure of the another one of the mask strips adjacent to the one of the mask strips in a direction perpendicular to the first boundary.

7. The mask plate of claim 1, wherein the plurality of foldable boundaries comprises a first foldable boundary and a second foldable boundary, the first foldable boundary is located between the foldable part and the at least one mask strip, and the second foldable boundary is located between the foldable part and the support part.

8. The mask plate of claim 7, wherein each of the first foldable boundary and the second foldable boundary defines a groove, when the folding structure is unfolded and the support part and the foldable part are on a same horizontal plane, the folding structure comprises a first surface and a second surface disposed oppositely, the groove at the first foldable boundary is located on the first surface, and the groove at the second foldable boundary is located on the second surface.

9. The mask plate of claim 8, wherein the groove are arc groove or tapered groove.

10. The mask plate of claim 8, further comprising elastic material disposed within the groove.

11. The mask plate of claim 7, wherein the first foldable boundary and the second foldable boundary are formed of elastic material, the folding structure has same material with the at least one mask strip, except for the first foldable boundary and the second foldable boundary.

12. The mask plate of claim 7, wherein the first foldable boundary and the second foldable boundary are provided with color marks, and the folding structure has same material with the at least one mask strip.

13. The mask plate of claim 1, wherein material of the at least one mask strip and at least part of the folding structure is magnetic material.

14. The mask plate of claim 1, wherein the at least one effective evaporation area is a plurality of effective evaporation areas disposed in a row.

15. The mask plate of claim 1, further comprising: a frame, configured to fix a position of the at least one mask strip, and the frame defining a plurality of receiving grooves matching with folding structures of the two opposite sides of the at least one mask strip at a plurality of positions corresponding to the folding structures, to receive the folding structures.

16. A mask plate, comprising:
a frame, defining a plurality of receiving grooves; and
at least one mask assembly, comprising:
a mask strip, fixed on the frame, the mask strip being provided with an effective evaporation area and a transition area located around the effective evaporation area; and
two folding structures, received in the plurality of receiving grooves, the folding structures and the receiving grooves being set in one-to-one correspondence, wherein one of the two folding structures is connected to one side of the mask strip, the other one of the two folding structures is connected to the other side of the mask strip; each of the two folding structures comprises a support part and a foldable part, such that the foldable part connects the support part to the mask strip and the folding structure is folded so as to sandwich the foldable part between the at least one mask strip and the support part,
wherein the foldable part comprises a plurality of foldable boundaries, and the foldable part is folded along the plurality of foldable boundaries to be disposed sandwiched between the at least one mask strip and the support part, and
wherein a width of the foldable part is dimensioned such that the foldable part blocks at least some of a plurality of openings provided in the transition area but does not block any of a plurality of openings provided in the effective evaporation area.

17. An evaporation system, comprising a mask plate of claim 1.

18. The evaporation system of claim 17, wherein the at least one mask strip and at least part of the folding structure of the mask plate are magnetic material, the evaporation system further comprises a magnetic device, configured to adsorb the at least one mask strip and at least part of the folding structure.

\* \* \* \* \*